(12) United States Patent
Courtenay et al.

(10) Patent No.: US 6,445,060 B1
(45) Date of Patent: *Sep. 3, 2002

(54) COATED SEMICONDUCTOR DIE/LEADFRAME ASSEMBLY AND METHOD FOR COATING THE ASSEMBLY

(75) Inventors: Robert Courtenay, Boise; Jerry M. Brooks, Caldwell, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/644,257

(22) Filed: Aug. 22, 2000

Related U.S. Application Data

(63) Continuation of application No. 08/947,011, filed on Oct. 8, 1997, now Pat. No. 6,107,690, which is a continuation of application No. 08/534,124, on Sep. 26, 1995, now abandoned.

(51) Int. Cl.$^7$ .................. H01L 23/28; H01L 23/495
(52) U.S. Cl. ............................ 257/666; 257/787
(58) Field of Search .................. 257/666, 783, 257/787, 792; 438/123; 361/813

(56) References Cited

U.S. PATENT DOCUMENTS

| | | | |
|---|---|---|---|
| 4,267,212 A | 5/1981 | Sakawaki | 427/240 |
| 4,486,945 A | 12/1984 | Aigoo | 29/588 |
| 5,087,962 A | 2/1992 | de Vos et al. | 357/70 |
| 5,233,130 A | 8/1993 | Nishino | 174/52.2 |
| 5,276,351 A | 1/1994 | Yamazaki et al. | 257/666 |
| 5,287,003 A | 2/1994 | Van Andel et al. | 257/792 |
| 5,310,702 A * | 5/1994 | Yoshida et al. | 438/127 |
| 5,403,617 A | 4/1995 | Haaland | 427/180 |
| 5,536,970 A | 7/1996 | Higashi et al. | 257/676 |
| 5,578,142 A | 11/1996 | Hattori et al. | 136/251 |
| 5,622,898 A * | 4/1997 | Zechman | 438/127 |
| 5,869,893 A | 2/1999 | Koseki et al. | 257/723 |
| 6,107,690 A * | 8/2000 | Courtenay et al. | 257/787 |

FOREIGN PATENT DOCUMENTS

| | | | |
|---|---|---|---|
| JP | 58-50759 | 3/1983 | H01L/23/28 |
| JP | 1-69039 | 3/1989 | H01L/23/30 |
| JP | 01-261853 | 10/1989 | H01L/23/50 |
| JP | 3-171655 | * 7/1991 | |
| JP | 04-15942 | 1/1992 | H01L/23/29 |

* cited by examiner

Primary Examiner—Jasmine J B Clark
(74) Attorney, Agent, or Firm—Dorsey & Whitney LLP

(57) ABSTRACT

A novel method for coating a semiconductor die/leadframe assembly prior to ocncapsulation. The method of the invention comprises coating the exposed surfaces of the die and the inner lead fingers in a die/leadframe assembly with an adhesion promoting material, typically a polyimide. A solution of the adhesion promoting material is dispensed from a spray nozzle to coat the die and the inner lead fingers, Preferably all exposed surfaces of the die, the inner lead fingers and the bond wires are coated prior to encapsulation. The invention also provides an improved semiconductor package that includes a semiconductor die/leadframe assembly and a layer of adhesion promoting material coating the exposed surfaces of the die and the inner lead fingers. The die/leadframe assembly is encapsulated in a molded plastic package.

24 Claims, 3 Drawing Sheets

COATED SEMICONDUCTOR DIE/LEADFRAME ASSEMBLY AND METHOD FOR COATING THE ASSEMBLY

RELATED APPLICATIONS

This application is a continuation of U.S. application Ser. No. 08/947,011, filed on Oct. 8, 1997; now U.S. Pat. No. 6,107,690 which is a continuation of U.S. application Ser. No. 08/534,124, filed on Sep. 26, 1995 and now abandoned.

FIELD OF THE INVENTION

The invention relates generally to semiconductor packaging and, more particularly, to a semiconductor die/leadframe assembly coated with an adhesion promoting material prior to encapsulation and a method for coating the die/leadframe assembly.

BACKGROUND OF THE INVENTION

During the final stages of the manufacture of many types of semiconductor devices, the individual dies (or chips) are mounted on a leadframe and encapsulated within a plastic or similar type molded package. The package insulates the die from environmental contaminants such as moisture and chemicals and protects the die from physical damage. The leadframe supports each die for packaging and provides lead fingers to connect the electrical devices formed in the die to a printed circuit board or other external circuitry.

Typically, leadframes are formed in strips of copper or other metal sheet stock. Several dies may be mounted on each leadframe strip. During a conventional packaging process, each die is attached to the center portion of a leadframe, or "paddle", with an adhesive. The adhesive is typically made of an epoxy, acrylic, silicone, or polyimide material that is sandwiched between the back of the die and the mounting paddle. The lead fingers are connected to bond pads formed on the die using very fine bond wires. In lead on chip ("LOC") packaging processes, the leadframe does not have a paddle and the die is mounted directly onto the lower surfaces of the lead fingers. Then, a layer of polyimide or other suitable adhesion promoting material is applied to the face of the die, and the die and the inner lead fingers (that portion of each lead finger immediately adjacent to the die) are encapsulated in a molded plastic package. A portion of each lead finger extends outside the package for connection to an external circuit. Finally, a trim and form operation is performed to sever the individual packages from the leadframe and to bend the outer lead fingers into the proper configuration.

Presently, the polyimide protective layer is drop (dispensed or "daubed") onto the face of the die prior to encapsulation. This polyimide layer helps protect the die from damage during encapsulation. The polyimide layer also increases the adhesion between the mold compound and the die. Conventional methods for drop dispensing polyimide, however, do not uniformly coat the die with the polyimide. Further, this method leaves the bond wires and inner lead fingers essentially uncoated. It would be advantageous to more uniformly coat the die with polyimide or other suitable adhesion promoting material, and to simultaneously coat the bond wires and the inner lead fingers. Increasing the polyimide coverage and the uniformity of that coverage would help reduce corner cracking and other damage to the passivation layer of the die known to be caused in part by poor coverage of the die face. In addition, coating the bond wires and lead fingers will increase the adhesion of the mold compound to those components and thereby reduce the incidence of "wiggle pin" and "heal break" type package failures typically caused by delamination of the mold compound from the leadframe. Such failures are particularly common in semiconductor devices wherein the die is large relative to the overall size of the package (i.e., a large die to package size ratio).

In view of the foregoing limitations in the packaging of semiconductor devices, there is a need in the semiconductor arts for an improved coated die/leadframe and method for coating such assemblies. Accordingly, it is one object of the invention to uniformly coat the die in a die/leadframe assembly with an adhesion promoting material prior to encapsulation. It is another object of the invention to coat the bond wires, inner lead fingers and die paddle, if applicable, prior to encapsulating those components in a plastic or similar type of molded package. It is a another object to reduce package delamination, cracking and similar types of package failures and to improve adhesion between the mold compound and the lead fingers, thereby reducing the incidence of bond wire breakage and bond failure.

SUMMARY OF THE INVENTION

The above objects and advantages are achieved by a novel method for coating a semiconductor die/leadframe assembly prior to encapsulation. A die is mounted on a leadframe having a plurality of lead fingers electrically connected to and extending outwardly away from the die. The method of the invention, broadly stated, comprises coating the exposed upper surfaces of the die and the exposed upper surfaces of the inner portion of the lead fingers with an adhesion promoting material, typically a polyimide. In one aspect of the invention, a solution of the adhesion promoting material is dispensed from a spray nozzle to coat the exposed upper surfaces of the die and the exposed upper surfaces of an inner portion of the lead fingers. Preferably, all exposed surfaces of the die, the inner lead fingers and the bond wires are coated prior to encapsulation.

Another aspect of the invention provides a method of forming a semiconductor package incorporating the coated die/leadframe assembly. In this aspect of the invention, the method comprises the steps of mounting a semiconductor die on a leadframe having a plurality of lead fingers electrically connected to and extending outwardly away from the die, coating exposed surfaces of the die and the exposed surfaces of the inner lead fingers with the adhesion promoting material, and then encapsulating the die and the inner lead fingers within a body of packaging material. Again, a solution of the adhesion promoting material is preferably dispensed from a spray nozzle to coat the die and the inner lead fingers.

The invention also provides an improved semiconductor package. A semiconductor die is mounted on a leadframe. The leadframe has a plurality of lead fingers electrically connected to and extending outwardly away from the die. A layer of adhesion promoting material coats the exposed surfaces of the die and the exposed surfaces of the inner lead fingers. A body of packaging material encapsulates the die and the coated portions of the lead fingers. Typically, the die/leadframe assembly will include bond wires that bond to and electrically connect the inner lead fingers and bond pads formed on the die. The bond wires are also coated with the adhesion promoting material and encapsulated within the body of packaging material.

DETAILED DESCRIPTION OF THE INVENTION

Figure 1:
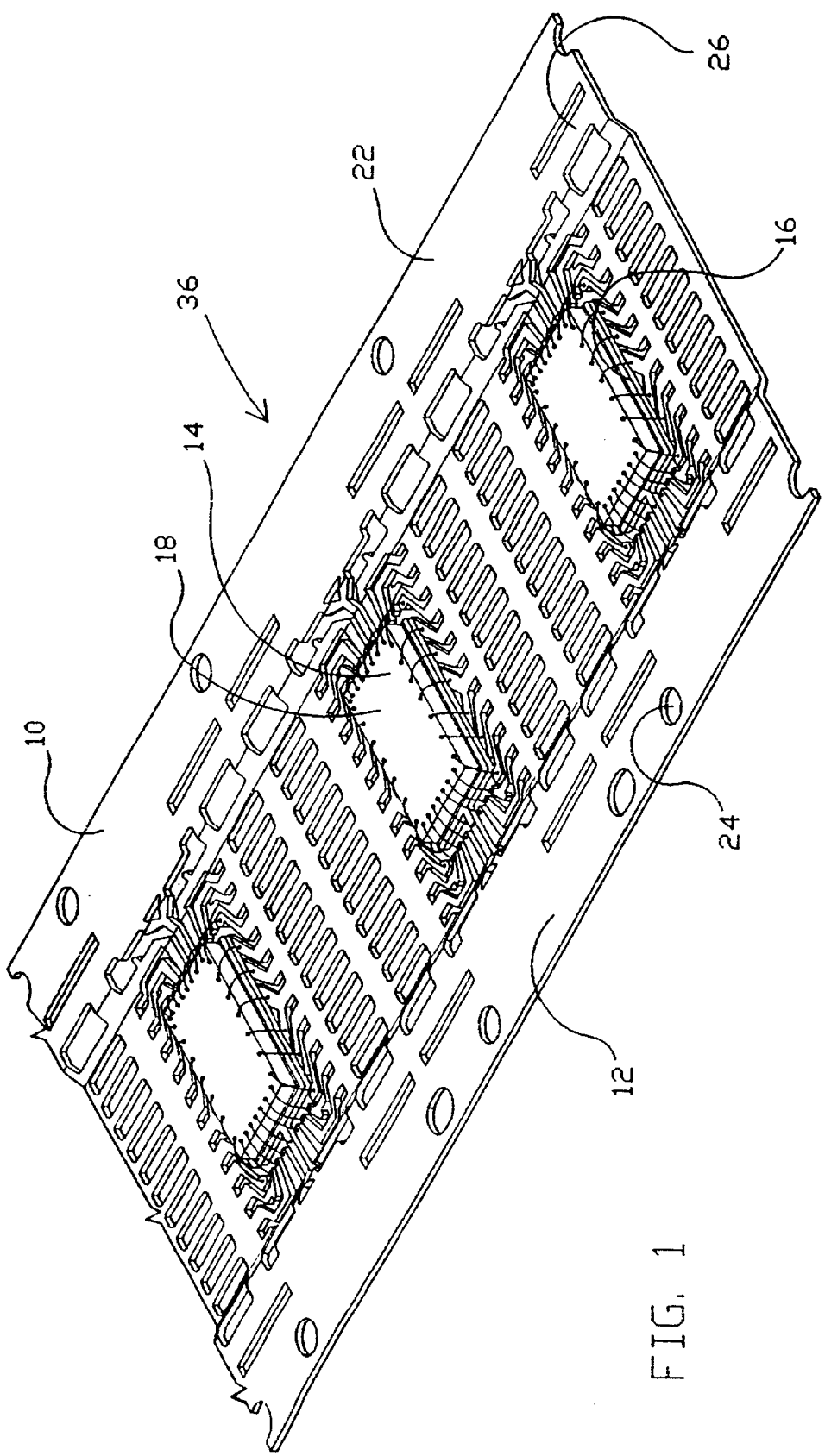
FIG. 1 is a perspective view illustrating a portion of a conventional lead frame strip after the semiconductor dies have been mounted on the individual leadframes.

Referring to FIG. 1, a conventional leadframe strip 10 includes a plurality of individual leadframes 12. A semiconductor die 14 is mounted on the center portion 16, commonly referred to as the die "paddle", of leadframe 12. Die 14, which is typically thin, flat and rectangular in shape, has a face 18 as its upper surface. Bond pads 20 (see FIG. 3) are formed along the edges of face 18 in electrical contact with the integrated circuits formed in die 14. Leadframe strip 10 is a thin sheet of metal, typically copper, and includes side rails 22 formed with indexing holes 24. Indexing holes 24 facilitate transport and indexing of leadframe strip 10 by automated packaging machinery. Leadframe 12 includes sidebars 24 to increase the rigidity of the leadframe and to limit the flow of mold compound during the encapsulation process. Leadframe 12 further includes a plurality of lead fingers 28. Lead fingers 28 (see FIGS. 2, 3) are typically positioned generally parallel to one another spaced along the perimeter of paddle 16 and extend outwardly from near paddle 16. Bond wires 30 (see FIGS. 2, 3) connect bond pads 20 to the inner portion 32 of lead fingers 28 immediately adjacent to die 14. Lead fingers 28 thus electrically connect the integrated circuitry of die 14, via bond pads 20 and bond wires 30, to external circuitry. In the case of lead on chip ("LOC") type packages (not shown), the leadframe does not have a paddle and the die is mounted directly onto the lower surfaces of the lead fingers, which supports the die during the packaging process. Side rails 22 and sidebars 24 are trimmed away and outer portion 34 of lead fingers 28 are bent to the proper configuration after encapsulation during a trim and form operation.

Figure 2:
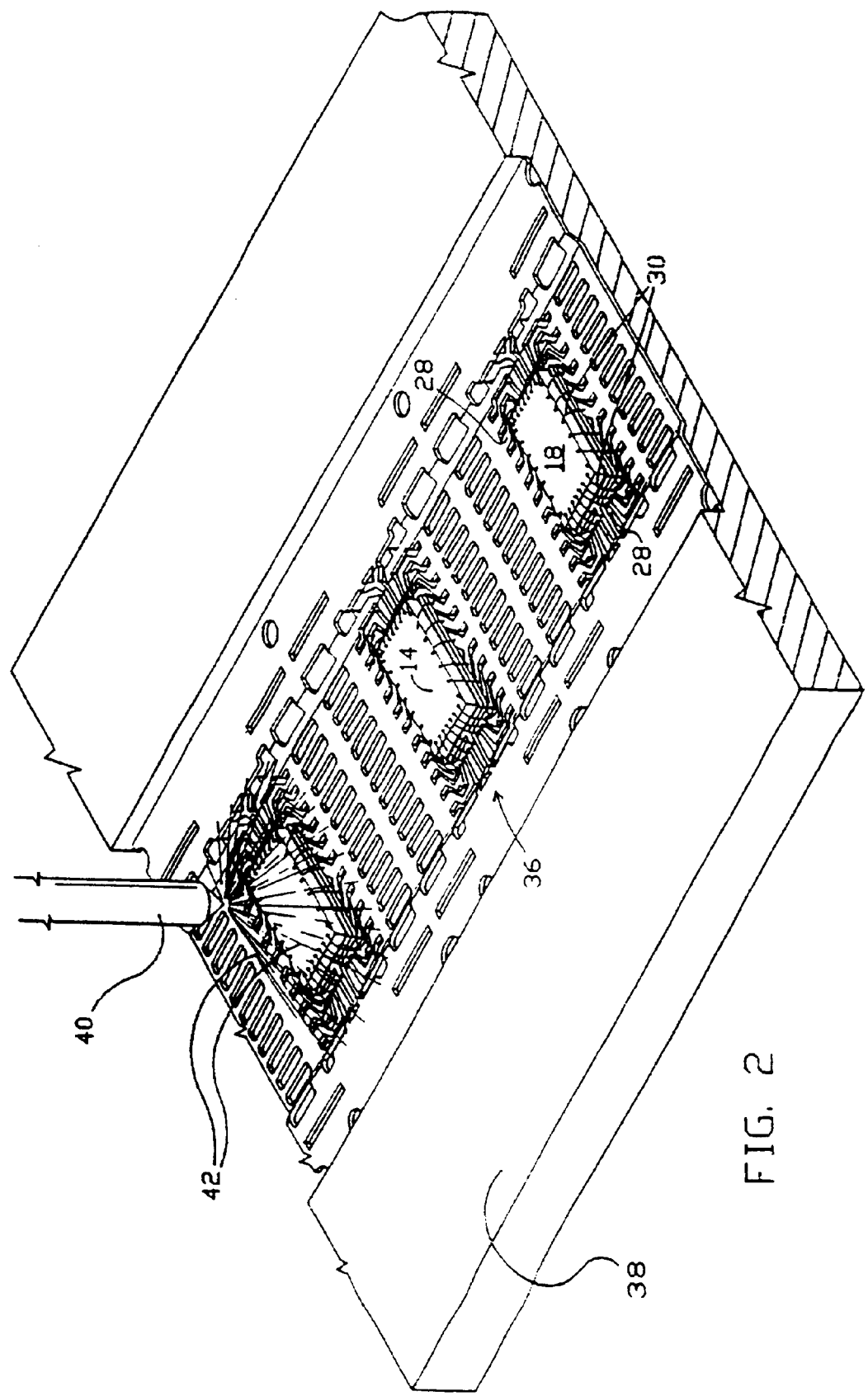
FIG. 2 is a perspective view illustrating the leadframe strip of FIG. 1 and the spray nozzle and carrier/support structure for coating the die/leadframe assemblies.

Referring now to FIG. 2, dies 14 are mounted on leadframes 12. Each die/leadframe assembly is indicated generally by reference numeral 36. Leadframe strip 10 is positioned on a suitable carrier/support structure 38. Carrier/support structure 38 is preferably configured and controlled to automatically move each die/leadframe assembly 36 into position under spray nozzle 40. A conventional indexing machine (e.g., an automated coating or inspecting machine) with a motor driven head capable of moving along two axes is suitable for automatically positioning the die/leadframe assemblies. A solution of polyimide or other suitable adhesion promoting material is dispensed through spray nozzle 40 onto each die/leadframe assembly in the form of a fine mist 42. Preferably, the adhesion promoting material solution has a solid content of less than 15%, most preferably in the range of 12%–6%, and a viscosity of not less than 50 centistoke. Conventional atomizing nozzles, airless spray nozzles and the like may be adapted for use with the polyimide solution to provide a relatively small spray pattern. For example, a Nordson® Select Coat System spray machine has been used successfully to dispense the polyimide solution. Preferably, the polyimide solution is dispensed onto the upper and lower surfaces of the (die/leadframe assembly 36. Spray nozzle 40 is preferably configured and controlled to dispense the polyimide solution onto die 14, paddle 16 and inner lead fingers 32 with little or no overspray. Any overspray may be removed by electrolytic or mechanical deflash processes well known in the art.

Figure 3:
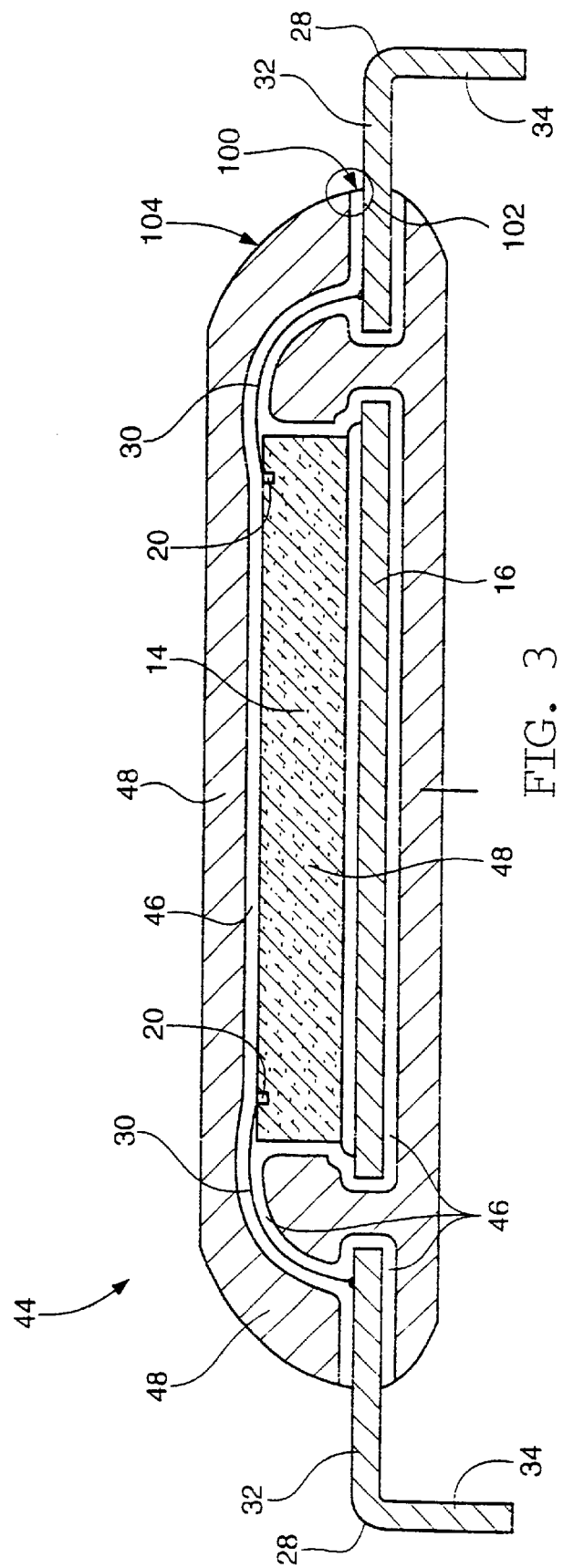
FIG. 3 is a cross-section view illustrating a semiconductor package incorporating the coated die/leadframe assembly of the present invention.

A semiconductor package 44 incorporating the coated die/leadframe assembly of the present invention is illustrated in FIG. 3. Referring to FIG. 3, die 14, bond wires 30, and inner lead fingers 32 are coated with a layer of polyimide 46 or other suitable adhesion promoting material and encapsulated in a body 48 of molded plastic or other suitable packaging material. Outer lead fingers 34, which are not coated, extend outside the body 48 of plastic.

FIG. 3 further depicts an exemplary embodiment wherein the layer of polyimide 46 has a smoothly contoured outside surface 100. Moreover, it should be noted that, in a region 102 where this surface 100 meets the surface 104 of the molded plastic body 48, a continuous curving transition from one surface to the other is defined. Because such a transition defines a curve rather that a straight line, the intersection of the surfaces 100 and 104 could be described as being non-rectilinear.

The improved semiconductor package of the present invention, wherein the die/leadframe assembly is coated with an adhesion promoting material prior to encapsulation, has been shown to reduce package delamination, cracking and similar types of failures. Coating the die/leadframe assembly has also been shown to improve adhesion between the mold compound and the lead fingers, thereby reducing the incidence of bond wire breakage and bond failure. Although the invention has been described in terms of the preferred embodiments, as will be apparent to those skilled in the art, other applications of the inventive concepts disclosed herein are possible. The particular embodiments shown in the drawings and described herein are for purposes of example and should not be construed to limit the invention as set forth in the appended claims.

What is claimed is:

1. A packaged part, comprising:
    an encapsulant defining a perimeter;
    a lead frame within said perimeter and having a lead finger extending from within said perimeter to without said perimeter;
    a die within said perimeter and mounted to said lead frame; and
    an adhesive layer located only within said perimeter, wherein said adhesive layer is interposed between said die and said encapsulant and further interposed between said lead finger and said encapsulant.

2. The packaged part of claim 1 wherein said adhesive layer has a smoothly contoured outside surface shaped so that an intersection between said surface of said adhesive layer and a surface of said encapsulant is non-rectilinear.

3. A die package, comprising:
    a die;
    a lead frame supporting said die and comprising:
        a plurality of lead fingers, wherein each lead finger of said plurality has a first portion and a second portion;
    an adherent contacting said die and further contacting all of said first portion to the exclusion of said second portion of said each lead finger of said plurality; and
    a mold around said first portion of said each lead finger of said plurality.

4. The die package of claim 3 wherein said adherent has a smoothly contoured outside surface shaped so that an intersection between said surface of said adherent and a surface of said mold is non-rectilinear.

5. A semiconductor device, comprising:
    a lead frame having a lead finger, wherein said lead finger has a first portion;

a die mounted on said lead frame;

a protective layer over said die and extending over said first portion of said lead finger; and a mold compound around said die, wherein said mold compound is also around said first portion of said lead finger to a degree coextensive with said protective layer, said protective layer having a smoothly contoured outside surface shaped so that an intersection between said surface of said protective layer and a surface of said mold compound is non-rectilinear.

6. The semiconductor device in claim 5, wherein said protective layer is around said die and extending around said first portion of said lead finger.

7. A lead-on-chip package, comprising:

a lead frame comprising a plurality of lead fingers;

a die directly contacting said plurality of lead fingers;

an adhesive around said die and around a portion of each lead finger of said plurality of lead fingers; and a mold around said adhesive.

8. The lead-on chip package of claim 7 wherein the adhesive has a smoothly contoured outside surface shaped so that an intersection between said surface of said adhesive and a surface of said mold is non-rectilinear.

9. A die assembly, comprising:

a die having a first side containing an electrical contact node and a second side parallel to said first side;

a lead frame comprising a lead finger in electrical communication with said electrical contact node;

a failure prevention layer over said die and extending over said lead frame; and a body extending over all of said failure prevention layer, said failure prevention layer having a smoothly contoured outside surface shaped so that an intersection between said surface of said failure prevention layer and a surface of said body is non-rectilinear.

10. The die assembly in claim 9, wherein:

said lead frame further comprises a die paddle supporting said die, proximate to said second side of said die, and distal to said first side of said die;

said die assembly further comprises a bond wire coupled to said electrical contact node and to said lead frame; and said failure prevention layer contacts said bond wire and said first side of said die.

11. The die assembly in claim 9, wherein:

said electrical contact node contacts said lead finger; and said failure prevention layer contacts said second side of said die.

12. The die assembly in claim 10, wherein said failure prevention layer contacts said first side of said die.

13. A die/leadframe assembly, comprising:

a plurality of lead fingers defining a plane;

a die electrically coupled to said plurality of lead fingers;

a delamination prevention layer on said die and extending along said plane onto said plurality of lead fingers; and a packaging material extending along said plane onto all of said delamination prevention layer.

14. The die/lead frame assembly of claim 13 wherein the delamination prevention layer has a smoothly contoured outside surface shaped so that an intersection between said surface of said delamination prevention layer and a surface of said body is non-rectilinear.

15. An in-process semiconductor device, comprising:

a leadframe;

a die comprising a bond pad surface and an opposite surface, wherein said leadframe and a selection of said bond pad surface and said opposite surface define an exposed portion of said device;

a first adhesive layer mounting said die to said leadframe; and a second adhesive layer over said exposed portion of said device.

16. The in-process semiconductor device of claim 15, wherein said leadframe and said opposite surface define said exposed portion.

17. The in-process semiconductor device of claim 15, wherein said leadframe and said bond pad surface define said exposed portion; and wherein said first adhesive layer is made of a first material and said second adhesive layer is made of a second material.

18. A protection layer for a die coupled to a lead frame and packaged within an encapsulating body, wherein said protection layer comprises a polyimide commensurate with said encapsulating body, surrounding said die, and surrounding a portion of said lead frame, said protection layer having a smoothly contoured outside surface shaped so that an intersection between said surface of said layer and a surface of said encapsulating body is non-rectilinear.

19. A circuit package, comprising:

an electrically conductive portion, comprising:
a leadframe, and
a die mounted on said leadframe; and an electrically non-conductive portion comprising:
an adhesive protection layer around said die and partially around said leadframe, and
a body around said die, partially around said leadframe and around at least a portion of said adhesive protection layer.

20. The circuit package of claim 19, wherein said adhesive protection layer is non-extensive beyond said body.

21. The circuit package of claim 19 wherein the adhesive protection layer has a smoothly contoured outside surface shaped so that an intersection between said surface of said adhesive protection layer and a surface of said body is non-rectilinear.

22. A packaging system, comprising:

a carrier configured to support a die/leadframe assembly; and a spray nozzle over said carrier and configured to dispense an adhesive onto said die/leadframe assembly, wherein said adhesive is coextensive with a subsequently provided encapsulant.

23. The packaging system in claim 22, wherein said carrier is configured to support a die mounted on a leadframe; and wherein said spray nozzle is configured to dispense said adhesive onto said die and onto a portion of said leadframe.

24. The packaging system in claim 23, wherein said system is configured to retain said adhesive on said portion of said leadframe.

* * * * *